United States Patent [19]

Hall et al.

[11] Patent Number: 4,631,199

[45] Date of Patent: Dec. 23, 1986

[54] PHOTOCHEMICAL VAPOR DEPOSITION PROCESS FOR DEPOSITING OXIDE LAYERS

[75] Inventors: James T. Hall, Redondo Beach; John W. Peters, Malibu, both of Calif.

[73] Assignee: Hughes Aircraft Company, Los Angeles, Calif.

[21] Appl. No.: 757,562

[22] Filed: Jul. 22, 1985

[51] Int. Cl.[4] .............................................. C23C 16/50
[52] U.S. Cl. ..................................... 427/54.1; 427/93
[58] Field of Search ....................... 427/53.1, 54.1, 93

[56] References Cited

U.S. PATENT DOCUMENTS

| | | | |
|---|---|---|---|
| 4,002,512 | 1/1977 | Lim | 427/93 |
| 4,109,030 | 8/1978 | Briska et al. | 427/93 |
| 4,371,587 | 2/1983 | Peters | 427/54.1 |
| 4,495,218 | 1/1985 | Azuma et al. | 427/93 |

Primary Examiner—John H. Newsome
Attorney, Agent, or Firm—Mary E. Lachman; A. W. Karambelas

[57] ABSTRACT

An improved process for depositing an oxide layer on a substrate by exposing the substrate to a selected vapor phase reactant and an oxygen-containing precursor comprising nitrous oxide mixed with molecular oxygen in a predetermined ratio, in the presence of radiation of a selected wavelength. The radiation causes the direct dissociation of the oxygen-containing precursor to form neutral oxygen atoms that react with the vapor phase reactant and form the oxide, which deposits as a layer on the substrate. The rate of reaction to form and deposit the oxide layer is enhanced by the mixing of molecular oxygen with nitrous oxide in the precursor.

4 Claims, 3 Drawing Figures

PHOTOCHEMICAL VAPOR DEPOSITION PROCESS FOR DEPOSITING OXIDE LAYERS

BACKGROUND OF THE INVENTION

1. Field of the Invention

The present invention relates generally to the fabrication of semiconductor devices and, more particularly, to a photochemical vapor deposition process for forming an oxide layer on the surface of a selected semiconductor material or an optical substrate, in a manner which enhances the oxide deposition rate.

2. Description of the Background Art

A recently developed technique for depositing oxide layers on a given substrate uses a photochemical reaction to generate neutral (nonionized) oxygen atoms, which then react with a chosen vapor phase reactant to form the desired oxide, which deposits as a layer on the substrate. This photochemical vapor deposition process is disclosed in U.S. Pat. Nos. 4,371,587 and 4,419,385, both assigned to the present assignee, and is useful in the fabrication of various devices and structures, for depositing an insulator or passivation oxide layer on a semiconductor material, glass or plastic lens, metal layer, mirrored surface, or solar cell. The use of photochemically generated neutral oxygen atoms avoids substrate damage due to charge bombardment or radiation bombardment. In addition, such a photochemical vapor deposition process can be conducted at a low temperature which avoids substrate damage due to thermal effects. As disclosed in U.S. Pat. No. 4,371,587, the neutral oxygen atoms may be generated by the mercury photosensitized dissociation of an oxygen-containing precursor or by the direct dissociation of an oxygen-containing precursor. In the mercury-sensitized reaction, a substrate is exposed to a chosen vapor phase reactant, such as silane ($SiH_4$), an oxygen-containing precursor, such as nitrous oxide ($N_2O$), and mercury vapor in the presence of radiation of a predetermined wavelength e.g. 2537 angstroms). The 2537 Å radiation excites the mercury atoms in the reactant gas mixture to form mercury atoms in an excited state (Hg*), approximately 5 electron volts above normal ground state, but non-ionized. The Hg* interacts with the oxygen-containing percursor, transfers energy to the precursor, and causes it to dissociate to produce atomic oxygen. The atomic oxygen then reacts with the vapor phase reactant to form the desired oxide, such as $SiO_2$ or $SiO$.

In the direct photodissociation method disclosed in U.S. Pat. No. 4,371,587, atomic oxygen is formed by the direct dissociation of the oxygen-containing precursor without the assistance of mercury sensitization. In this direct process, the substrate is exposed to a chosen vapor phase reactant, such as silane, and an oxygen-containing precursor in the presence of radiation of a predetermined wavelength sufficient to cause the direct dissociation of the oxygen-containing precursor to produce atomic oxygen. When nitrous oxide is used as the oxygen-containing precursor, radiation having a wavelength within the range of 1750 to 1950 angstroms is sufficient to cause the direct dissociation of the nitrous oxide to form atomic oxygen and nitrogen as shown in Reaction (1) below. It is convenient to use 1849 Å radiation for this purpose since this is the resonance line of a low pressure mercury vapor lamp which is conventionally used as the radiation source. The atomic oxygen then reacts with the vapor phase reactant, such as silane, to form the desired oxide, such as silicon dioxide or silicon monoxide.

$$N_2O + hc/\lambda(1750-1950 \text{ Å}) \rightarrow O(^1D) + N_2 \quad (1)$$

Where
h=Planck's constant
c=speed of light
λ=wavelength of light

The notation of $O(^1D)$ represents a singlet-D oxygen atom, which is a neutral oxygen atom in its first excited state.

Alternatively, the atomic oxygen may be formed by the direct photochemical dissociation of molecular oxygen as shown in Reaction (2) below or of nitrogen dioxide ($NO_2$) as shown in Reaction (3) below or of similar known materials which are capable of being dissociated to atomic oxygen by a direct photochemical reaction.

$$O_2 + hc/\lambda(1750-1950 \text{ Å}) \rightarrow 2O(^3P) \quad (2)$$

$$NO_2 + hc/\lambda(3500-6000 \text{ Å}) \rightarrow O(^3P) + NO \quad (3)$$

The notation $O(^3P)$ represents a triplet-P oxygen atom, which is a neutral oxygen atom in its ground state. Since molecular oxygen can react spontaneously and uncontrollably with silane, it is necessary to inhibit this spontaneous thermal oxidation process in order to permit the formation of atomic oxygen and the reaction thereof with the silane. This inhibition is accomplished by carefully controlling the operating pressure and the ratio of reactant gases and properly diluting the molecular oxygen with nitrogen gas. Higher deposition rates may be achieved using molecular oxygen rather than $N_2O$ or $NO_2$ as discussed above. However, in the case of oxygen, the quality of the deposited film is degraded, and unwanted powder or particulates form throughout the deposition equipment.

The mercury-sensitized photochemical vapor deposition process for depositing oxide layers is advantageous because of its higher deposition rates as compared to the direct photochemical vapor deposition process. However, in certain situations, the presence of mercury vapor may be undesirable. For example, a mercury-free environment may be critical to certain semiconductor surface passivations and dielectric bulk properties in order to avoid the incorporation of mercury into the dielectric layer or semiconductor surface and the resulting degradation of the electrical properties of the device. In addition, due to health, safety, and environmental considerations it is desirable to avoid the use of mercury. The direct photolysis process previously described avoids the problems due to mercury contamination. However, the known direct photolysis process does not have sufficiently high deposition rates to make such a process of practical use in the fabrication of semiconductor devices.

Thus, there exists in the industry the need for a photochemical vapor deposition process which avoids the use of mercury vapor, while at the same time having sufficiently high deposition rates as to be practicable.

SUMMARY OF THE INVENTION

The general purpose of this invention is to provide a new and improved process for depositing an oxide layer on a chosen substrate by a photochemical vapor deposition process having enhanced deposition rates. This process possesses all of the advantages of the above prior art oxide deposition processes, while overcoming their above mentioned significant disadvantages.

The above general purpose of this invention is accomplished by exposing the substrate to a selected vapor phase reactant and an oxygen-containing precursor comprising a mixture of nitrous oxide admixed with molecular oxygen in a predetermined ratio, in the presence of radiation of a selected wavelength. The radiation causes the direct dissociation of the oxygen-containing precursor to form neutral oxygen atoms that react with the vapor phase reactant and form the oxide, which deposits as a layer on the substrate. The rate of reaction to form and deposit the oxide layer is enhanced by the mixing of molecular oxygen with nitrous oxide in the precursor.

Accordingly, it is a purpose of the present invention to provide a new and improved photochemical vapor deposition process for depositing an oxide layer on a substrate, in which the use of mercury vapor is avoided.

Another purpose of the present invention is to provide a direct photolysis process of the type described which has enhanced deposition rates that are of practical values.

Still another purpose of the present invention is to provide a direct photolysis process of the type described which has optimum efficiency.

The foregoing and other objects, features, and advantages of the present invention will be apparent from the following more particular description of the preferred embodiments of the invention, as illustrated in the accompanying drawings.

DETAILED DESCRIPTION OF THE INVENTION

Figure 1:
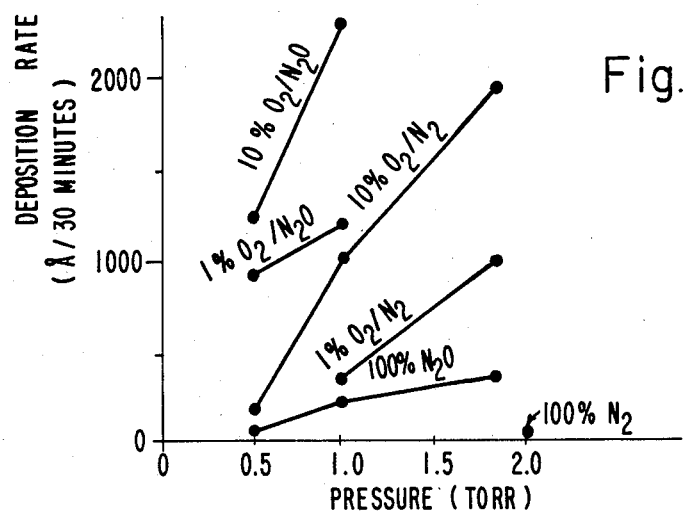
FIG. 1 presents curves showing the deposition rates at various operating pressures for various oxygen-containing mixtures used in practising the process of the present invention and in practising two prior art processes.

In accordance with the process of the present invention, the direct photolysis process for depositing an oxide layer is conducted as generally described in U.S. Pat. No. 4,371,587, the details of which are incorporated herein by reference. The selected vapor phase reactant contains the element for which the oxide is desired as the final product. Such vapor phase reactants include, for example, silane, trimethyl aluminum, trimethyl gallium, germane, diborane, trimethyl indium, titanium tetrachloride, tungsten hexafluoride, hafnium hydride, dimethyl zinc, zirconium acetylacetonate, tetraethyl lead, tetramethyl tin, tin chloride, and dimethyl cadmium. The substrate may be, for example, a semiconductor wafer such as silicon or mercury cadmium telluride, a glass or plastic lens, a metal layer in a multilayer semiconductor device, a mirrored surface, or a solar cell.

In the direct photolysis method as practiced in the art and previously described herein, the oxygen-containing precursor comprises either pure nitrous oxide or a mixture of oxygen in nitrogen. Pure nitrous oxide offers the advantage of controllability, but has the disadvantage of a very low deposition rate. A mixture of about 10 percent oxygen in nitrogen diluent gas provides a faster deposition rate than nitrous oxide. However, molecular oxygen is so reactive with metal precursors, such as SiH$_4$ or Al(CH$_3$)$_3$, that a spontaneous thermal reaction can occur in the reaction chamber or associated tubing and can cause serious problems such as uncontrollability, unwanted powder formation, and degradation of the reaction equipment.

In accordance with the present invention, we have discovered that by using a mixture of a relatively small quantity of oxygen in nitrous oxide as the oxygen-containing precursor, unexpectedly high oxide deposition rates can be achieved. These deposition rates are much higher than those to be expected from the separate use of either partial pressure component of the precursor gas mixture, namely, oxygen or nitrous oxide alone.

The direct dissociation of nitrous oxide and of oxygen by 1849 angstrom radiation is shown in Reactions (1') and (2') below. While 1849 Å radiation is indicated, any radiation within the range of 1750 to 1950 Å is sufficient to produce the required direct dissociation, as previously discussed herein.

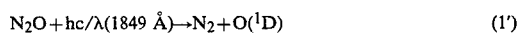 (1')

 (2')

The ground state, triplet-P oxygen atom, indicated as O($^3$P), is much more reactive with the vapor phase reactant for oxide thin film deposition than the excited state, singlet-D oxygen atom, indicated as O($^1$D), since the former undergoes an oxidative termination reaction of the type required to oxidize the vapor phase reactant, while the latter undergoes a chemical bond insertion reaction in which the oxygen is inserted between two bonded atoms. In addition, O($^3$P) has a longer lifetime than O($^1$D). Moreover, it is known that O($^1$D) is converted to O($^3$P) by third body collision (M), such as a wall or another gaseous species, e.g., N$_2$, as indicated in Reaction (4). The latter reaction further limits the availability of O($^1$D) for reaction.

 (4)

Thus, the main reaction for oxide formation in accordance with the present invention uses O($^3$P), as shown in Reaction (5). The overall reaction for the process of the present invention is as shown in Reaction (6).

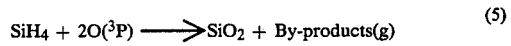 (5)

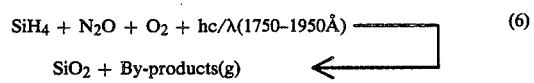 (6)

Even though the photodissociation of O$_2$ alone yields ground state atoms in Reaction (2) above, complications can occur from a series of reactions including: ozone formation in Reaction (7); ozone photodissociation in Reaction (8); excited molecular oxygen formation in Reactions (8) and (9); and excited molecular oxygen reactions with ozone in Reactions (10) and (11), below.

$$O(^3P) + O_2 \xrightarrow{M} O_3 \quad (7)$$

$$O_3 + hc/\lambda(1700\text{–}3600\text{Å}) \longrightarrow O_2(^1\Delta_g) + O(^3P) \quad (8)$$

$$2O_2(^1\Delta_g) \longrightarrow O_2(^1\Sigma_g^+) + O_2 \quad (9)$$

$$O_2(^1\Delta_g) + O_3 \longrightarrow 2O_2 + O(^3P) \quad (10)$$

$$O_2(^1\Sigma_g^+) + O_3 \longrightarrow 2O_2 + O(^3P) \quad (11)$$

$O_2(^1\Delta_g)$ and $O_2(^1\Sigma_g^+)$ indicate neutral oxygen molecules in excited singlet states. The potential energy curves for these various states of the oxygen molecule are presented by Calvert and Pitts, in the book entitled "Photochemistry," John Wiley and Sons, New York, 1966, at page 180.

While not limiting the present invention to a particular theory of operation, it is believed that the enhanced deposition rate is achieved as the result of synergistic oxygen photochemistry which could involve several possible paths for producing ground state oxygen atoms from excited state atoms more efficiently than previously achieved. To explain the observed enhancement mechanism, it is hypothesized that the synergistic reactants are species that do not normally come in contact with each other during $N_2O$ photolysis as in Reactions (1) and (4) or during $O_2$ photolysis as in Reactions (2) and (7) through (11). For example, interactions between excited oxygen atoms and oxygen molecules are possible that may lead to more efficient production of ground state oxygen atoms. Two possible mechanistic paths for such interactions are illustrated below. Mechanism 1 involves physical quenching of $O(^1D)$ to $O(^3P)$ by molecular oxygen, as shown in Reaction (12a) or (12b) below; and Mechanism 2 involves chemical quenching of $O(^1D)$ by $O_2$ to form ozone, as shown in Reaction (13) below and subsequent photolysis of ozone to form $O(^3P)$ as shown in Reaction (8).

Mechanism 1

$$N_2O + hc/\lambda \longrightarrow O(^1D) + N_2 \quad (1)$$

$$O_2 + O(^1D) \longrightarrow O(^3P) + O_2(^1\Sigma_g^+) \quad (12a)$$

or $$O_2 + O(^1D) \longrightarrow O(^3P) + O_2(^1\Delta_g) \quad (12b)$$

Mechanism 2

$$N_2O + hc/\lambda \longrightarrow O(^1D) + N_2 \quad (1)$$

$$O_2 + O(^1D) \xrightarrow{M} O_3 \quad (13)$$

$$O_3 + hc/\lambda \longrightarrow O(^3P) + O_2(^1\Delta_g) \quad (8)$$

Since the absorption characteristics of $O_3$ for the formation of ground state atomic oxygen are broader and stronger than those for either $N_2O$ or $O_2$, Reactions (13) and (8) may play important synergistic roles in the observed enhancement. In addition, since Reaction (11) is known to occur at a very fast rate, this particular step may play an important synergistic role in the observed enhancement.

Either Mechanism 1 or Mechanism 2 may account for the enhanced production of $O(^3P)$. However, in Mechanism 1, the physical quenching of $O(^1D)$ by $O_2$, under certain conditions, is known to be equal to or less than physical quenching with molecular nitrogen which is formed in Reaction (1) in excess. Therefore, the physical quenching pathway described in Mechanism 1 is probably less significant than the chemical quenching pathway shown in Mechanism 2. Mechanism 2 illustrates how $O(^1D)$ can be converted to the desired $O(^3P)$ in a more effective manner than the third body collision mechanism ordinarily encountered in the photolysis of $N_2O$ alone.

The net effect of this synergistic oxygen photochemistry is to provide the desired oxidative species, i.e. $O(^3P)$, in larger quantities, more efficiently, and more practically than could be previously achieved and to thus provide substantially increased oxide deposition rates of practical utility. In addition, this enhancement of the desired oxidative species in accordance with the present process occurs independently of the particular vapor phase reactant, such as silane, trimethyl aluminum, etc., used. Thus, the present process may be applied to any of the vapor phase reactants previously discussed, to produce significant enhancement in the rate of oxide deposition.

Using the apparatus and process described in U.S. Pat. No. 4,371,587 for the third embodiment therein, the process of the present invention was performed on a 3-inch silicon wafer to deposit a layer of silicon dioxide. The silicon dioxide product was identified by its optical, physical, and chemical properties. A low pressure mercury vapor lamp was used as the source of 1849 Å radiation. FIG. 1 presents experimental data for the deposition rates at various operating pressures in practising the process of the present invention and in practising two prior art processes. The silane, oxygen, nitrous oxide, and nitrogen were each contained in a separate chamber with an associated control valve or flow meter by which the flow rate of the respective gases was controlled. The flow rate of silane was 2 standard cubic centimeters per minute (sccm); the flow rate was 100 sccm for the oxygen-containing mixture comprising oxygen and nitrous oxide for the present process or oxygen and nitrogen or nitrous oxide alone for the comparative prior art processes; and the operating pressure in the reaction chamber was varied from 0.5 to 2.0 torr (millimeters of mercury) or about 60 to 270 pascals. In the process of the present invention, the oxygen and nitrous oxide may be introduced separately into the reaction chamber or they may be premixed in the desired proportion and then introduced into the reaction chamber. In FIG. 1, solid lines form families of data with identical ratios of components in the oxygen-containing mixture. The data presented in FIG. 1 are for the following compositions of the oxygen-containing precursor and are designated as such in FIG. 1: (a) 100% $N_2$ (control) (b) 100% $N_2O$ (prior art); (c) 1% $O_2$ in $N_2$ (prior art); (d) 10% $O_2$ in $N_2$ (prior art); (e) 1% $O_2$ in $N_2O$ in accordance with the present invention; and (f) 10% $O_2$ in $N_2O$ in accordance with the present invention. As indicated by the data of FIG. 1, the greatest enhancement in deposition rate was achieved using mixtures of oxygen and nitrous oxide in accordance with the process of the present invention.

Figure 2:
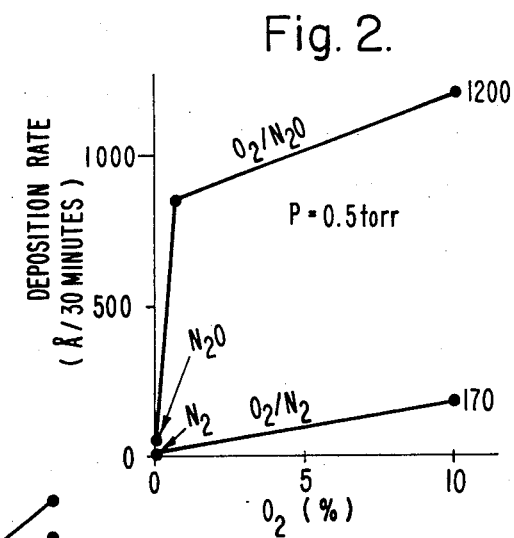
FIG. 2 presents curves showing the deposition rate versus the content of the oxygen mixture in practising the process of the present invention and in practising two prior art processes.

FIG. 2 presents experimental data for the rate of oxide deposition achieved using various oxygen-containing mixtures. The same flow rates as in FIG. 1 were used and an operating pressure of 0.5 torr was used. The following compositions of the oxygen-containing precursor were used and are designated as such in FIG. 2: (a) a mixture of oxygen and nitrogen varying from 0 to 10 percent oxygen (prior art); (b) a mixture comprising oxygen and nitrous oxide varying from 0 to 10 percent oxygen in accordance with the present invention; and (c) nitrous oxide alone as the oxidant (prior art). As can be seen from the data in FIG. 2, the process of the present invention using a mixture of oxygen and nitrous oxide achieves a deposition rate of 1200 Å/30 minutes, which represents a 23-fold increase as compared to the 50 Å/30 minutes deposition rate produced by nitrous oxide alone, and a 7-fold rate increase as compared to the 170 Å/30 minutes deposition rate produced by a mixture of oxygen and nitrogen. Such significantly increased deposition rates, which are clearly not due to a simple additive effect, are unexpected in view of the rates achieved by the closely related prior art processes using nitrous oxide alone or molecular oxygen alone as the oxygen-containing precursor. In relation to FIG. 2, it should also be noted that 1 percent oxygen in nitrous oxide gives an enhancement of the deposition rate nearly as high as 10 percent oxygen in nitrous oxide, which suggests that enhancement becomes saturated as the oxygen/nitrous oxide ratio is increased. In practice, the amount of molecular oxygen incorporated in the mixture of nitrous oxide and oxygen used in the process of the present invention may be increased to 20 percent or even higher, with the practical upper limit for molecular oxygen being determined by the point at which the oxide starts to deposit in the form of a powder, rather than a specular film. This upper limit depends also, in part, on process parameters, such as operating pressure and silane flow rate.

Figure 3:
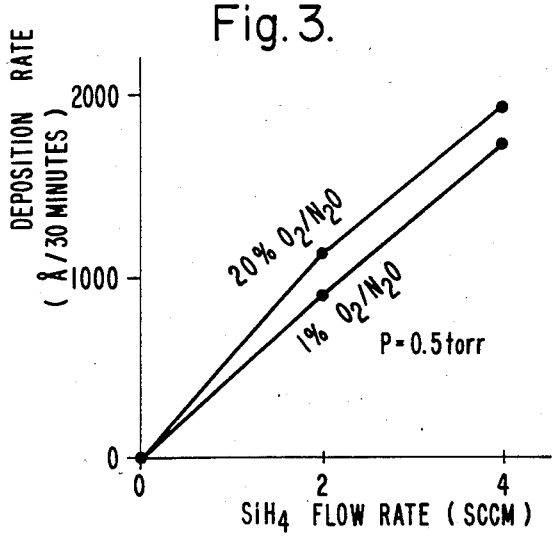
FIG. 3 presents curves showing the deposition rate versus the silane flow rate for the process of the present invention.

FIG. 3 shows the variation in the oxide deposition rate in accordance with the process of the present invention as the silane flow rate is varied. The combined flow rate of oxygen and nitrous oxide was 100 sccm and the operating pressure in the reaction chamber was 0.5 torr. FIG. 3 presents the data for the process of the present invention using an oxygen-containing mixture comprising: (a) 1 percent oxygen in nitrous oxide; and (b) 20 percent oxygen in nitrous oxide. The refractive index of the silicon dioxide product was measured to be 1.46. As can be seen by examining FIG. 3, a mixture of 1 percent oxygen in nitrous oxide produces nearly as high an enhancement of the deposition rate as a mixture of 20 percent oxygen in nitrous oxide. In addition, the deposition rate is nearly linear with silane flow rate. FIG. 3 indicates that a sufficient quantity of oxidizing species is present to react with essentially all of the silane and that the deposition rate is limited by the amount of silane available for deposition. Thus, by increasing the amount of silane in the reactant gases, enhancement can be increased even more. This result suggests that a small oxygen/nitrous oxide ratio can be used with a higher silane flow rate to increase enhancement even more. In addition, it has been experimentally determined that the area of uniformity of the deposited layer can be increased at higher flow rates of the reactants and lower operating pressures. However, the ratio of the oxidant to silane must be maintained at about 50:1 or higher in order to produce silicon dioxide of the desired stoichiometry.

As indicated by the data of FIGS. 1–3 previously discussed, in accordance with the process of the present invention, a deposition rate of silicon dioxide of about 1200 angstroms in 30 minutes at about 0.5 torr (60 pascals) can be readily achieved without the formation of powder. It is recognized that deposition rates are dependent on equipment design. Using conventional equipment and an operating pressure of 0.5 torr (60 pascals), typical deposition rates of about 2 Å/minute for the prior art nitrous oxide reactant and 5–10 Å/minute for 10 percent oxygen in nitrogen are usually achieved. However, using the process of the present invention and the same conventional equipment, it is anticipated that deposition rates can be increased about twenty-fold to 100 to 200 Å/minute. In addition, by the process of the present invention using $O_2/N_2O$ mixtures, significantly higher deposition rates are obtained at 0.5 torr (60 pascals) than for the known process using $O_2/N_2$ mixtures while simultaneously avoiding powder formation which can be manifested at higher pressures, such as 1.0 to 2.0 torr (133 to 270 pascals). Thus, the process of the present invention provides a method for depositing a layer of an oxide material on a chosen substrate at practical deposition rates which are compatible with a production environment. In addition, the process of the present invention can be readily controlled by controlling the reactant gas flow rates, reaction chamber pressure, and radiation intensity. The prior art problem of the spontaneous reaction of the vapor phase reactant with molecular oxygen is avoided by the present process in which dilute oxygen mixtures are used. Moreover, the process of the present invention avoids the use of mercury and the previously discussed problems associated therewith. In addition to avoiding the problems of possible mercury contamination, the process of the present invention is more controllable than a mercury-sensitized process in which surface evaporation depends on the prior history of the mercury, which cannot be readily controlled.

Having thus described exemplary embodiments of the present invention, it should be noted by those skilled in the art that the disclosures within are exemplary only and that various other alternatives, adaptations, and modifications may be made within the scope of the present invention. Accordingly, the present invention is not limited to the deposition of a layer of silicon dioxide which was used merely as an example, but is intended to include the photochemical vapor deposition of other oxide materials, such as aluminum oxide, gallium oxide, germanium oxide, boron oxide, indium oxide, titanium dioxide, tungsten oxide, hafnium oxide, lead oxides, tin oxides, zinc oxide, zirconium oxide, tellurium oxide, and cadmium oxide.

What is claimed is:

1. A photochemical vapor deposition process for depositing a layer of an oxide of a chosen material on the surface of a selected substrate comprising the steps of:

(a) providing said substrate; and (b) exposing said substrate to a selected vapor phase reactant and an oxygen-containing precursor comprising a mixture of nitrous oxide admixed with molecular oxygen in a predetermined ratio, in the presence of radiation of a selected wavelength sufficient to cause the direct dissociation of said oxygen-containing precursor to form neutral oxygen atoms that react with said vapor phase reactant and form said oxide which deposits as said layer on said substrate, wherein the rate of reaction to form and deposit said oxide is enhanced by said molecular oxygen in said mixture.

2. The process of claim 1 wherein said mixture comprises molecular oxygen in the amount of about 1 to 20 percent.

3. The process of claim 1 wherein said selected vapor phase reactant is silane, said wavelength of said radiation is about 1849 angstroms, and said oxide is predominantly silicon dioxide.

4. The process of claim 3 wherein:
  (a) said mixture comprises from about 1 to about 20 percent molecular oxygen;
  (b) the flow rate of said mixture is about 100 standard cubic centimeters per minute;
  (c) the flow rate of said silane is within the range of about 2 to 4 standard cubic centimeters per minute;
  (d) the pressure at which said process is performed is within the range of about 0.5 to 2.0 torr (60 to 270 pascals); and
  (e) the rate of deposition of said oxide is within the range of about 900 to 2300 angstroms in 30 minutes.

* * * * *